United States Patent
Jin et al.

(10) Patent No.: US 6,927,152 B2
(45) Date of Patent: Aug. 9, 2005

(54) METHOD FOR FABRICATING SEMICONDUCTOR DEVICE

(75) Inventors: Seung Woo Jin, Kyoungki-do (KR); Tae Hyeok Lee, Kyoungki-do (KR); Bong Soo Kim, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/738,394

(22) Filed: Dec. 17, 2003

(65) Prior Publication Data

US 2004/0175894 A1 Sep. 9, 2004

(30) Foreign Application Priority Data

Mar. 5, 2003 (KR) ................................. 10-2003-0013716

(51) Int. Cl.⁷ ............................................ H01L 21/425
(52) U.S. Cl. ........................ 438/530; 438/532; 438/533
(58) Field of Search ................................ 438/532, 533, 438/514, 530

(56) References Cited

U.S. PATENT DOCUMENTS

| | | | |
|---|---|---|---|
| 5,554,565 A | 9/1996 | Liaw et al. | |
| 5,599,736 A | * 2/1997 | Tseng | 438/659 |
| 5,970,331 A | 10/1999 | Gardner et al. | |
| 6,051,487 A | 4/2000 | Gardner et al. | |
| 6,214,682 B1 | * 4/2001 | Wang | 438/301 |
| 6,277,739 B1 | 8/2001 | Tseng | |
| 6,284,581 B1 | 9/2001 | Pan et al. | |
| 6,312,981 B1 | * 11/2001 | Akamatsu et al. | 438/217 |
| 6,596,632 B2 | 7/2003 | Roberts et al. | |

* cited by examiner

*Primary Examiner*—Trung Dang
(74) *Attorney, Agent, or Firm*—Ladas & Parry LLP

(57) ABSTRACT

The present invention relates to a method for fabricating a semiconductor device. The method comprises the steps of: 1. A method for fabricating a semiconductor device, which comprises the steps of: forming a gate line on a semiconductor substrate; forming junction regions in the semiconductor substrate at both sides of the gate line; forming and selectively removing an interlayer insulating film on the substrate to form contact holes exposing the junction regions; forming plugs in the contact holes; and implanting impurity ions into the plugs; and annealing the junction regions.

9 Claims, 1 Drawing Sheet

US 6,927,152 B2

METHOD FOR FABRICATING SEMICONDUCTOR DEVICE

BACKGROUND OF THE INVENTION

1. Field of the Invention

The present invention relates to a method for fabricating a semiconductor device, and a more particularly, to a method for fabricating a semiconductor device, which allows the cell current of the semiconductor device to be increased.

2. Description of the Prior Art

Among the properties of a semiconductor device, cell current is generally connected with tWR (Write Recovery time) margin failure. If tWR margin is insufficient, the write margin of stored information will be insufficient and thus write failure will occur.

In the prior art, to increase cell current, there is used a method of increasing the doping concentration of plugs, or a method of performing an ion implantation process after forming the plugs.

In such a prior art, since a rapid thermal annealing (RTA) process is performed before forming the plugs, out-diffusion effect from the plug is insignificant and thus an increase in cell current is also insufficient.

To increase cell current, an additional ion implantation process is also frequently performed after forming the plug. In this case, however, since this ion implantation process is performed at low temperature, it has an insignificant effect on the increase of cell current.

Namely, as a device becomes fine, channel doping concentration is increased. Thus, the prior method encounters a limitation in increasing the cell current of the device.

Furthermore, in developing a 110 nm device, the prior method ensures only a cell current of 25–30 $\mu A$ without satisfying the cell current requirement of 37 $\mu A$ or more in products. Thus, the prior method has a problem in that tWR bit failure occurs in several thousands of bits.

SUMMARY OF THE INVENTION

Accordingly, the present invention has been made to solve the above-mentioned problems occurring in the prior art, and an object of the present invention is to provide a method for fabricating a semiconductor device, in which a rapid thermal annealing process is performed after forming plugs, so that the cell current of the device is increased and tWR bit failure is reduced.

To achieve the above object, the present invention provides a method for fabricating a semiconductor device, which comprises the steps of: forming a gate line on a semiconductor substrate; forming junction regions in the semiconductor substrate at both sides of the gate line; forming and selectively removing an interlayer insulating film on the resulting substrate to form contact holes exposing the junction regions; forming plugs in the contact holes; and implanting impurity ions into the plugs; and annealing the junction regions.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described in detail with reference to the accompanying drawings.

Figure 1A:
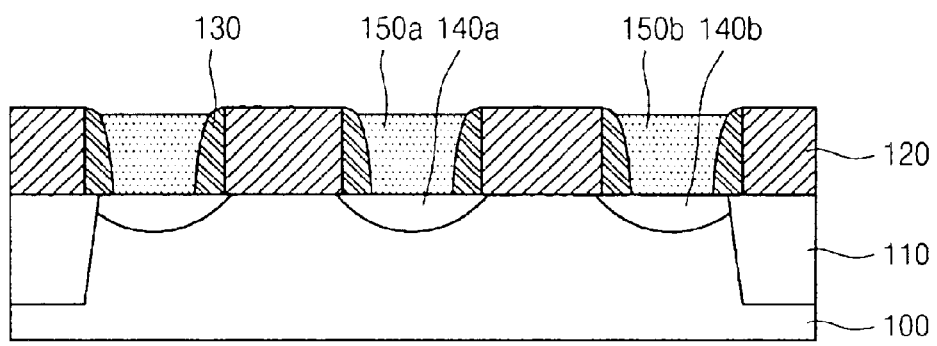
FIGS. 1A and 1B are cross-sectional views for illustrating a fabricating method of a semiconductor device according to a preferred embodiment of the present invention.
Figure 1B:
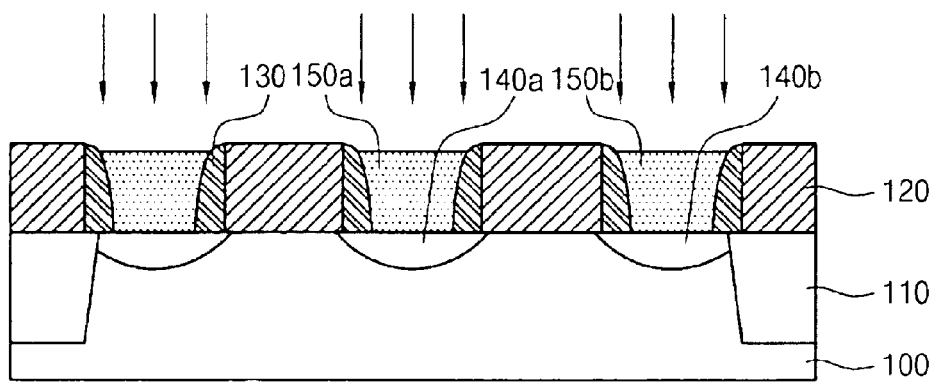

FIGS. 1A and 1B are cross-sectional views for illustrating a fabricating method of a semiconductor device according to a preferred embodiment of the present invention.

As shown in FIG. 1A, a device isolation film 110 is first provided in a silicon substrate 100 and then a gate line 120 is formed on the silicon substrate 100.

Thereafter, spacers 130 are formed on both sides of the gate line 120, and then an ion implantation process is performed to form a bit line contact 140a and a storage node contact 140b.

At this time, a rapid thermal annealing process is not carried out.

Next, an interlayer insulating film (not shown) is formed on the entire upper surface of the resulting substrate. Then, a portion of the interlayer insulating film between the gate lines 120 is selectively etched to expose the upper surfaces of the bit line contact 140a and the storage node contact 140b, thereby forming a bit line contact hole (not shown) and a storage node contact hole (not shown) in the interlayer insulating film.

Next, a polysilicon layer for plugs is formed on the entire upper surface of the resulting substrate, and then planarized by an etchback process or a chemical mechanical process (CMP) process, thereby forming a bit line contact plug 150a and a storage node contact plug 150b in the bit line contact hole and the storage node contact hole.

After forming the contact plugs, an isolation film, such as an oxide film or a nitride film, may also be formed on the plugs.

Then, as shown in FIG. 1B, impurity ions are implanted into the contact plugs 150a and 150b, after which the bit line contact 140a and the storage node contact 140b are subjected to a rapid thermal annealing (RTA) process.

Here, the process of implanting the impurity ions into the plugs is carried out using phosphorus (P) or arsenic (As) source gas, at an ion implantation energy of 10–40 KeV and a dose of 1.0E15–1.0E16.

And, the rapid thermal annealing process is carried out at a temperature of 850–1,100° C., a ramp-up rate of 10–200° C./s and a ramp-down rate of 10–200° C./s for 10–60 sec under a gas atmosphere of $N_2$, $O_2$, $N_2/O_2$ mixture, Ar, $NH_3$ or $N_2O$.

When the isolation film is formed, the process of the impurity ions into the plugs is conducted under the same condition as described above except that an ion implantation energy of 10–80 KeV is used. Also, the rapid thermal annealing process is performed under the same condition after forming the isolation film or under the same condition after forming the contact plugs 150a and 150b but before forming a metal contact mask.

Alternatively, the process of implanting the impurity ions into the contact plugs 150a and 150b may also be performed after conducting the rapid thermal annealing process.

In this alternative embodiment, the rapid thermal annealing process is carried out at a temperature of 850–1,100° C., a ramp-up rate of 10–200° C./s and a ramp-down rate of 10–200° C./s for 10–60 sec under a gas atmosphere of $N_2$, $O_2$, $N_2/O_2$ mixture, Ar, $NH_3$ or $N_2O$.

Also, the process of implanting the impurity ions into the plugs is carried out using phosphorus (P) or arsenic (As)

source gas at an ion implantation energy of 10–40 KeV and a dose of 1.0E15–1.0E16.

After conducting the process of implanting the impurity ions into the plugs, a furnace annealing process is carried out at a temperature of 600–900° C. to perform the out-diffusion of the implanted impurity ions.

Subsequent processes are the same as the prior art, and thus, the description thereof will not be omitted here for brevity.

The following Table 1 shows the results of various measurements for a semiconductor device fabricated by the method of the present invention.

TABLE 1

| item in 110 nm technology | Prior art | Invention | Invention |
|---|---|---|---|
| First RTA process | 1,017° C./10 s | — | — |
| Doping concentration of plug | 1.50E20 | 1.50E20 | 1.50E20 |
| Second RTA process | — | — | 988° C./20 s |
| Process for ion implantation into plug | 20 KeV, P, 5.0E15 | 20 KeV, P, 5.0E15 | 20 KeV, P, 5.0E15 |
| Third RTA process | — | — | — |
| Cell Vt | 0.91 V | 0.9 V | 0.9 V |
| Cell current | 33 µA | 46 µA | 43 µA |

As described above, according to the present invention, out-diffusion resulting from ion implantation into the plugs occurs in addition to out-diffusion from the plugs, cell current can be increased by the maximum of about 80% as compared to the prior method.

Also, according to the present invention, cell current is increased by about 40–50% as compared to the prior method in 110 nm technology, so that a cell current of 44 µA satisfying the cell current requirement of 37 µA is ensured. Thus, tWR bit failure caused by insufficient cell current margin can be reduced from several thousands of bits in the prior art to 10–50 bits in the present invention, and a tWR property of 5–7 ns satisfying the tWR requirement of less than 8 ns can be ensured.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for fabricating a semiconductor device, which comprises the steps of:
   forming a gate line on a semiconductor substrate;
   forming junction regions in the semiconductor substrate at both sides of the gate line;
   forming and selectively removing an interlayer insulting film on the resulting substrate to form contact holes exposing the junction regions;
   forming plugs in the contact holes by performing an etchback process or a CMP process, wherein no annealing process is performed prior to the current step of forming the plugs in the contact holes; and
   implanting impurity ions into the plugs; and
   annealing the junction regions.

2. The method of claim 1, wherein the step of annealing the junction regions is conducted by a rapid thermal annealing (RTA) process.

3. The method of claim 1, wherein the step of implanting the impurity ions into the plugs is performed alter the step of annealing the junction regions.

4. The method of claim 3, which additionally comprises the step of performing a furnace annealing process after the step of implanting the impurity ions.

5. The method of claim 4, wherein the furnace annealing process is performed at a temperature of 600–900° C.

6. The method of claim 1 or 3, wherein the step of implanting the impurity ions into the plugs is carried out using phosphorus (P) or arsenic (As) source gas at an ion implantation energy of 1040 KeV and a dose of 1.0E15–1.0E16.

7. The method of claim 1 or 3, wherein the step of annealing the junction regions is carried out at a temperature of 850–1,100° C., a ramp-up rate of 10–200° C./s and a ramp-down rate of 10–200° C./s for 10–60 sec under a gas atmosphere of $N_2$, $O_2$, $N_2/O_2$ mixture, Ar, $NH_3$ or $N_2O$.

8. The method of claim 1, which additionally comprises the step of forming an oxide film or a nitride film on the plugs.

9. The method of claim 8, wherein the step of implanting the impurity ions into the plugs is carried out using phosphorous (P) or arsenic (As) source gas at an ion implantation energy of 10–80 KeV and a dose of 1.0E15–1.0E16.

* * * * *

UNITED STATES PATENT AND TRADEMARK OFFICE
CERTIFICATE OF CORRECTION

PATENT NO. : 6,927,152 B2  Page 1 of 1
APPLICATION NO. : 10/738394
DATED : August 9, 2005
INVENTOR(S) : Seung Woo Jin, Tae Hyeok Lee and Bong Soo Kim It is certified that error appears in the above-identified patent and that said Letters Patent is hereby corrected as shown below:

Column 4, line 31, that portion of the claim reading "-1040 KeV-" should read --10–40 KeV--.

Signed and Sealed this

Fifteenth Day of May, 2007

JON W. DUDAS
*Director of the United States Patent and Trademark Office*